United States Patent
Maruyama

(10) Patent No.: US 7,742,089 B2
(45) Date of Patent: Jun. 22, 2010

(54) CMOS SOLID-STATE IMAGE PICKUP DEVICE AND DRIVE METHOD THEREOF

(75) Inventor: Yasushi Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 638 days.

(21) Appl. No.: 10/545,733

(22) PCT Filed: Feb. 18, 2004

(86) PCT No.: PCT/JP2004/001820

§ 371 (c)(1),
(2), (4) Date: Aug. 16, 2005

(87) PCT Pub. No.: WO2004/075540

PCT Pub. Date: Sep. 2, 2004

(65) Prior Publication Data

US 2006/0192874 A1    Aug. 31, 2006

(30) Foreign Application Priority Data

Feb. 19, 2003 (JP) .............................. 2003-040729

(51) Int. Cl.
*H04N 5/335* (2006.01)
*H01L 31/062* (2006.01)
*H01L 27/00* (2006.01)

(52) U.S. Cl. ...................... 348/294; 348/310; 257/292; 250/208.1

(58) Field of Classification Search ................. 348/294, 348/310; 257/292, 233, 290
See application file for complete search history.

(56) References Cited

U.S. PATENT DOCUMENTS

| 6,140,630 | A   | 10/2000 | Rhodes |            |
|-----------|-----|---------|--------|------------|
| 6,184,055 | B1* | 2/2001  | Yang et al. | 438/57  |
| 6,246,043 | B1* | 6/2001  | Merrill | 250/208.1 |
| 6,362,019 | B1* | 3/2002  | Kuriyama | 438/60  |
| 6,433,373 | B1* | 8/2002  | Lee et al. | 257/292 |

FOREIGN PATENT DOCUMENTS

JP     11-274458     10/1999
JP     2002-247456   8/2002

OTHER PUBLICATIONS

European Search Report dated Jan. 22, 207.
Japanese Office Action dated Sep. 9, 2008 for Application No. 2003-040729.

* cited by examiner

*Primary Examiner*—Nhan T Tran
*Assistant Examiner*—Mekonnen Dagnew
(74) *Attorney, Agent, or Firm*—Sonnenschein Nath & Rosenthal LLP

(57) ABSTRACT

A CMOS solid state imaging device is capable of achieving a higher image quality while reducing the size and power consumption and increasing the number of pixels and speeds. According to the invention, in a CMOS solid state imaging device, including a light-receiving portion (11) that performs photoelectric conversion according to a quantity of received light, a transfer gate (12a) used to read out charges obtained through the photoelectric conversion in the light-receiving portion (11), and a peripheral transistor provided in a periphery of the light-receiving portion (11), and a driving method of the same, a voltage applied to the transfer gate (12a) is set higher than a voltage applied to the peripheral transistor.

12 Claims, 6 Drawing Sheets

CMOS SOLID-STATE IMAGE PICKUP DEVICE AND DRIVE METHOD THEREOF

TECHNICAL FIELD

The present invention relates a CMOS solid state imaging device that obtains an image signal by transferring charges obtained through photoelectric conversion in a pixel portion from a transfer gate to charge-to-potential converting means, and to a driving method of the same.

BACKGROUND ART

A CMOS solid state imaging device can be reduced more in size and power consumption than a CCD (Charge Transfer Device), and is therefore used as an imaging device in a digital still camera or a cellular phone.

In order to achieve a further reduction in size and power consumption in the CMOS solid state imaging device, it is necessary to reduce a power supply voltage by reducing an area per pixel according to the scaling law and reducing the dimensions of elements forming the pixel. A pixel region can be thus reduced and the sensitivity is reduced proportionally.

Incidentally, Japanese Patent No. 2618939 discloses a technique in the related art aimed at increasing the speeds and an image quality in a CCD. This technique can prevent mixing of signal charges (signal deterioration) among horizontal CCD registers when high-speed reading is performed using a CCD that has been reduced in size and increased in resolution.

The technique to prevent signal deterioration in the CCD has been disclosed; however, there is no satisfactory countermeasure against S/N deterioration when a quantity of charges that can be handled in the CMOS solid state imaging device is lessened. In other words, the CMOS solid state imaging device has an advantage that the pixel portion and peripheral circuits can be manufactured in the same process; however, when the pixel region is reduced according to the scaling law, a power supply voltage is reduced as well. This reduces a voltage applied to the transfer gate used when charges are read out from the pixel portion, which gives rise to S/N deterioration caused by a reduced quantity of saturation charges.

DISCLOSURE OF THE INVENTION

The invention was devised to solve the foregoing problems. More specifically, the invention provides a CMOS solid state imaging device, including a pixel portion that performs photoelectric conversion according to a quantity of received light, a transfer gate used to readout charges obtained through the photoelectric conversion in the pixel portion, and a peripheral transistor provided in a periphery of the pixel portion, and a driving method of the same, wherein a voltage applied to the transfer gate is set higher than a voltage applied to the peripheral transistor.

The invention also provides a CMOS solid state imaging device including an imaging region and a circuit region provided in a same chip in which the imaging region is present, wherein: the imaging region includes plural pixels; each of the plural pixels has a light-receiving portion that generates charges according to a quantity of received light, and a transfer gate that reads out the charges from the light-receiving portion; and a voltage applied to the transfer gate is higher than a voltage applied to a gate of any of transistors included in the peripheral circuit region.

BEST MODE FOR CARRYING OUT THE INVENTION

Figure 1:
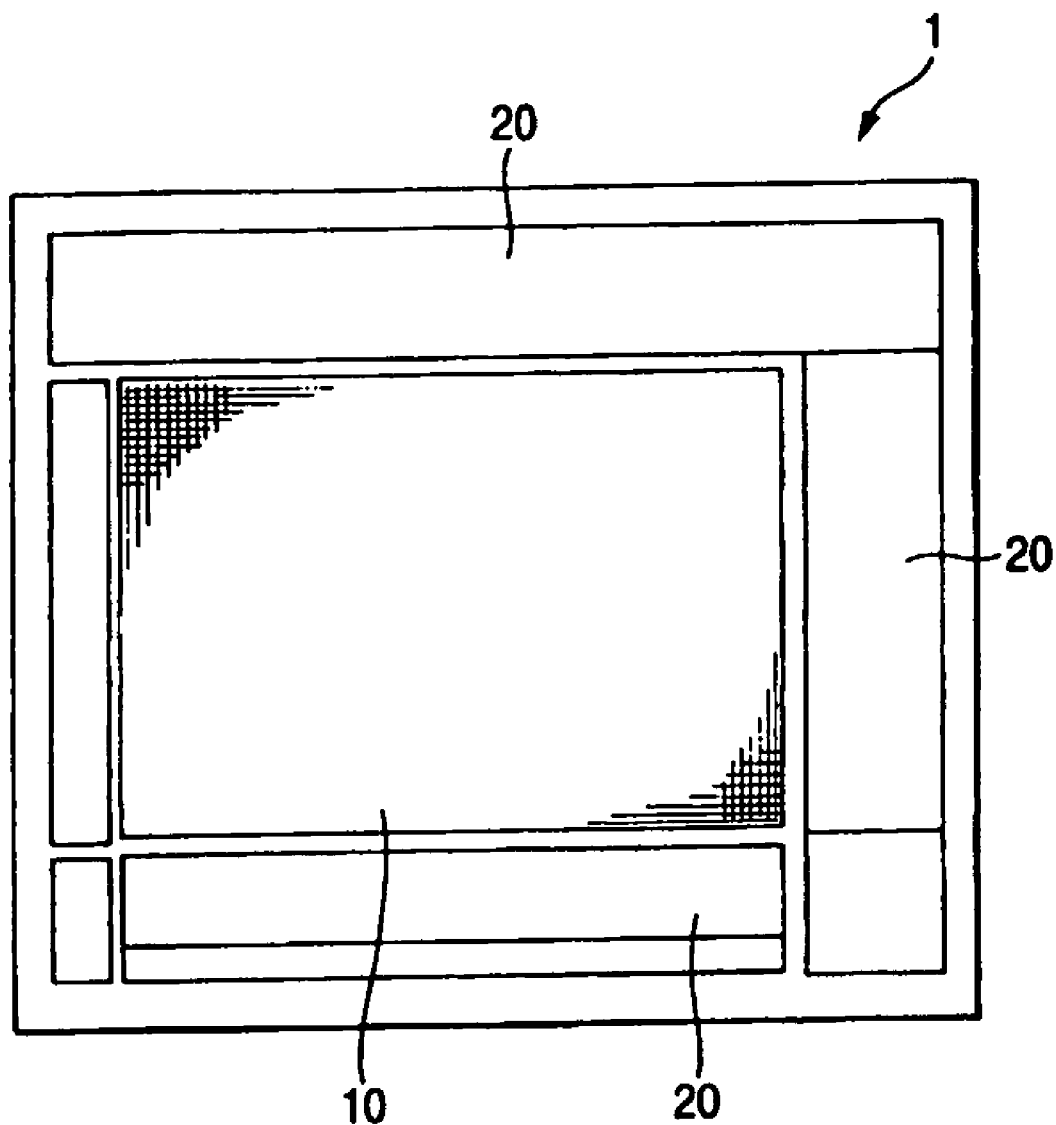
FIG. 1 is an entire plan view used to describe a CMOS solid state imaging device according to one embodiment.
Figure 2:
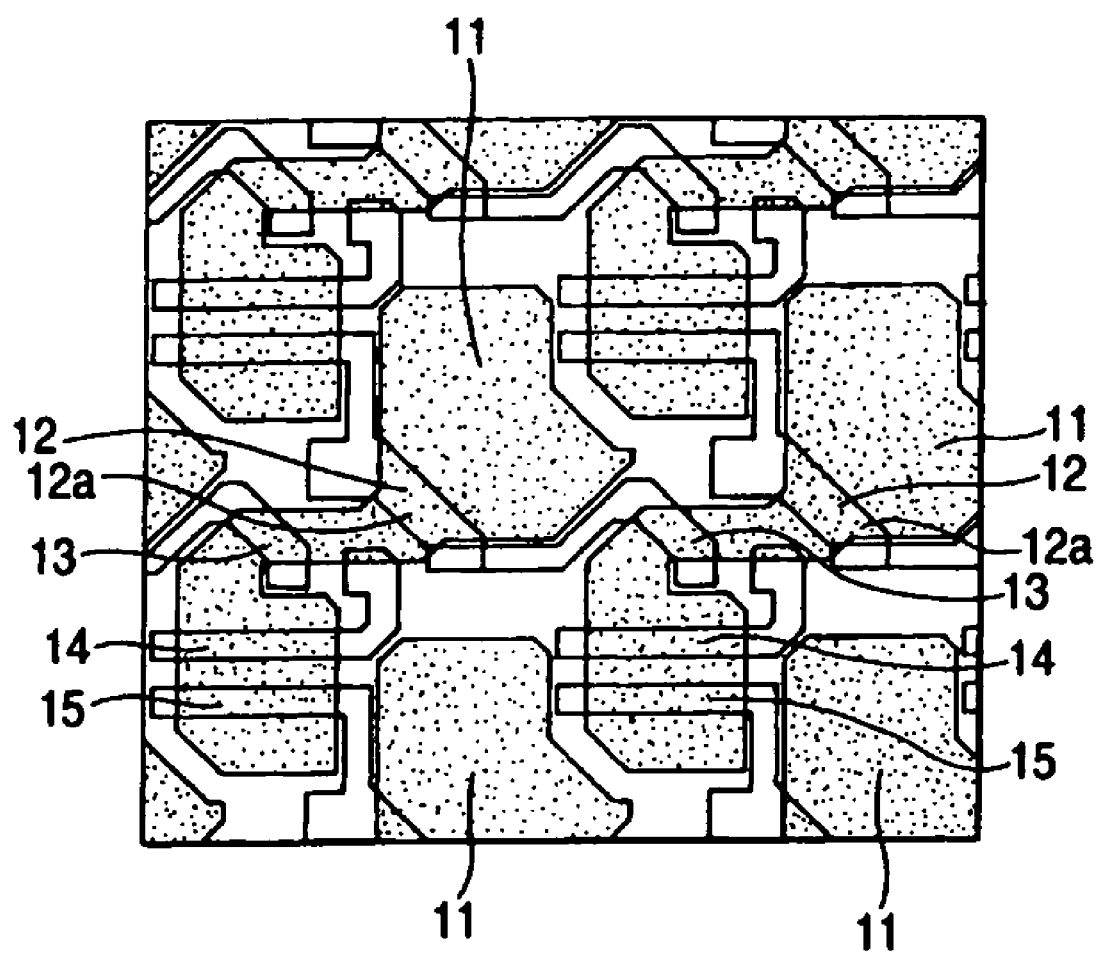
FIG. 2 is an enlarged plan view of a pixel portion of the CMOS solid state imaging device according to one embodiment.
Figure 3:
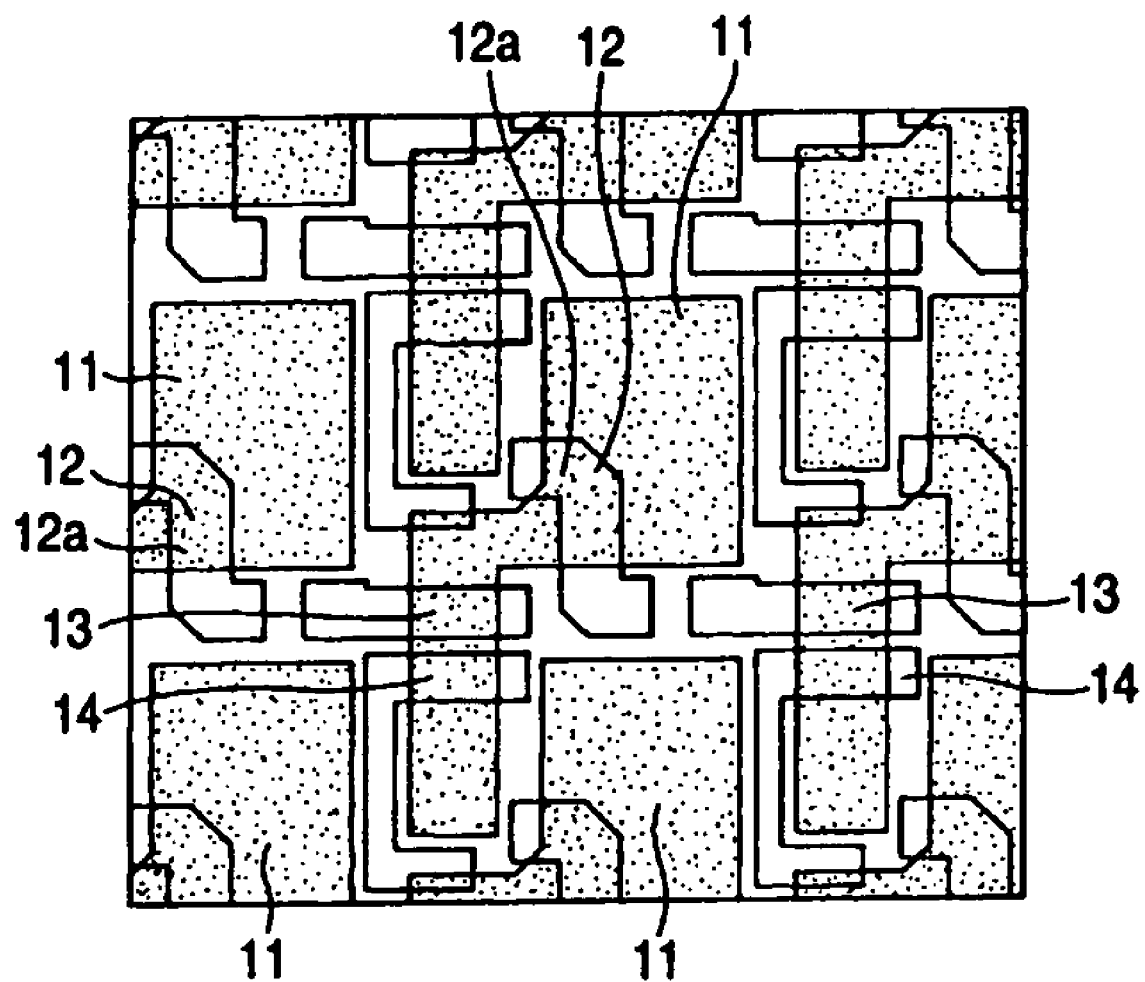
FIG. 3 is an enlarged plan view of another pixel portion.

Hereinafter, one embodiment of the invention will be described with reference to the drawings. FIG. 1 is an entire plan view used to describe a CMOS solid state imaging device of this embodiment. FIG. 2 is an enlarged plan view of a pixel portion of the CMOS solid state imaging device of this embodiment. FIG. 3 is an enlarged plan view of another pixel portion.

More specifically, as is shown in FIG. 1, a CMOS solid state imaging device 1 of this embodiment is configured to have an imaging region 10 and peripheral circuit regions 20 within one chip. Plural pixel portions are aligned laterally and longitudinally in the imaging region 10, and a read transistor having a transfer gate, an amplifying transistor, etc. are formed to correspond to each pixel portion.

Also, a circuit that controls a current source supplied to the respective pixel portions and the respective transistors in the imaging region 10, a circuit that process a signal loaded in the respective pixel portions, etc. are formed in the peripheral circuit regions 20.

An example shown in FIG. 2 is a 4-transistor type CMOS solid state imaging device in which a read transistor 12, a reset transistor 13, an amplifying transistor 14, and a select transistor 15 are disposed to correspond to each light-receiving portion 11. An example shown in FIG. 3 is a 3-transistor type CMOS solid state imaging device in which a read transistor 12, a reset transistor 13, and an amplifying transistor 14 are disposed to correspond to each light-receiving portion 11.

In either case, the CMOS solid state imaging device of this embodiment is characterized in that a voltage (VTx) applied to a transfer gate 12a of the read transistor 12 is set higher than a voltage (VG) applied to the other peripheral transistors.

The peripheral transistors referred to herein include the transistors operating in the peripheral circuit regions 20 shown in FIG. 1, and the amplifying transistor 14 and the select transistor 15 provided to correspond to each light-receiving region 11 shown in FIG. 2 and FIG. 3.

By setting a voltage applied to the transfer gate 12a higher than a voltage applied to the peripheral transistors, even when a driving voltage of the peripheral transistors is reduced by reducing a space and power consumption of the peripheral transistors according to the scaling law and increasing speeds thereof, a saturation quantity of charges that can be read out from the light-receiving portion 11 via the transfer gate 12a does not have to be reduced, because a voltage applied to the transfer gate 12a corresponding to the light-receiving portion 11 is high.

Figure 4:
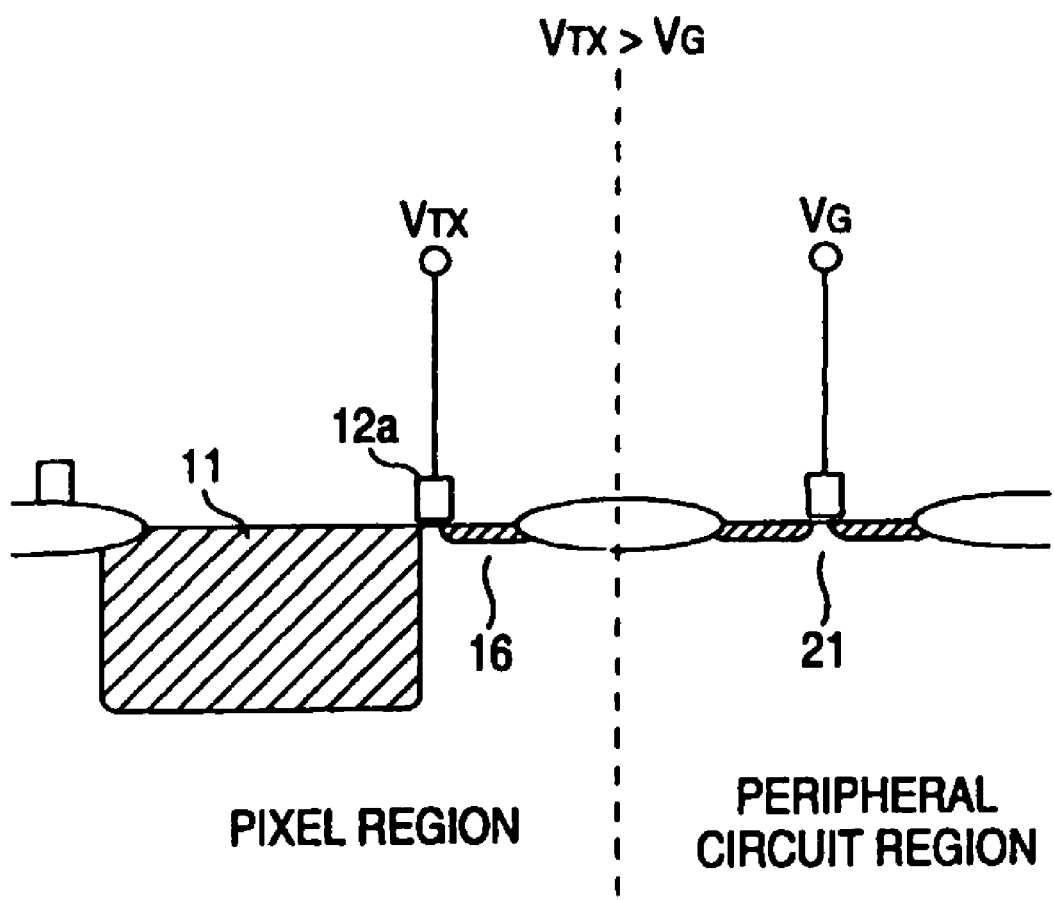
FIG. 4 is a schematic cross section used to describe a first concrete example.

FIG. 4 is a schematic cross section used to describe a first concrete example. Each pixel portion is provided with the light-receiving portion 11 comprising one photo diode, and the transfer gate 12a and a Floating Diffusion (charge-to-voltage conversion portion) 16 corresponding to the light-receiving portion 11, while a Logic Tr. (logic transistor) 21 is disposed in the peripheral circuit region.

In this example, the voltage VTx applied to the transfer gate 12a and the voltage VG applied to the logic transistor 21 have a relation such that satisfies VTx>VG. By setting the voltage VTx applied to the transfer gate 12a higher than the voltage VG applied to the logic transistor 21 in the peripheral circuit region in this manner, it is possible to increase the number of signal charges that can be completely transferred from the light-receiving portion 11, that is, a quantity of saturation charges. Hence, not only can the number of pixels be increased and the size and power consumption can be reduced according to the scaling law of the elements, but also a higher S/N and a higher image quality can be achieved.

Figure 5:
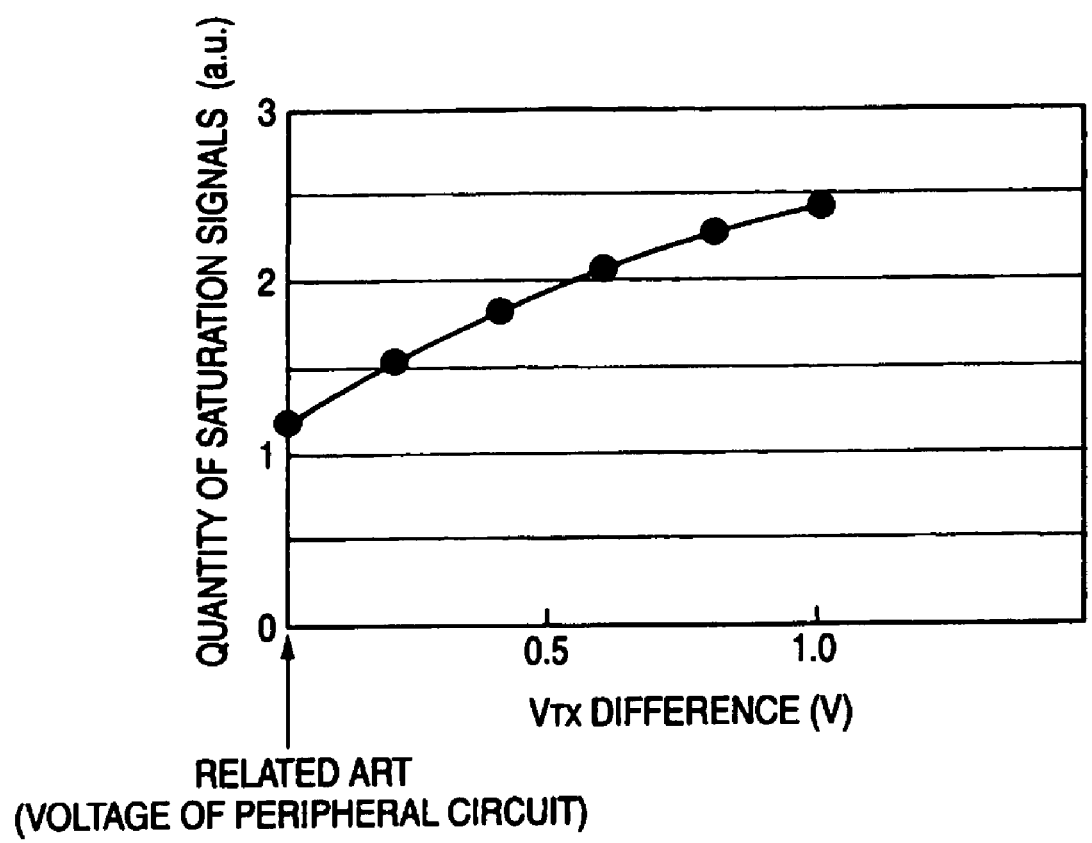
FIG. 5 is a view showing a simulation result of a relation between a voltage VTx and a quantity of saturation signals.

FIG. 5 is a view showing a simulation result of a relation between the voltage VTx and a quantity of saturation signals. The abscissa of the graph is used for a VTx difference (a difference from a driving voltage of the peripheral transistors), and the ordinate is used for a quantity of saturation signals (a.u.). As is shown in the drawing, when there is a VTx difference of about 0.5 V, a quantity of saturation signals shows nearly a 2-fold increase. This indicates that even a slight voltage difference gives considerable influences to a quantity of saturation signals.

A quantity of saturation signals can be increased by increasing the VTx difference; however, the gate length becomes longer as the VTx difference is increased, which results in a reduction of the pixel portion region. The VTx difference is therefore preferably on the order of 0.5 V to 1.0 V at which the pixel portion region remains unsusceptible.

Figure 6:
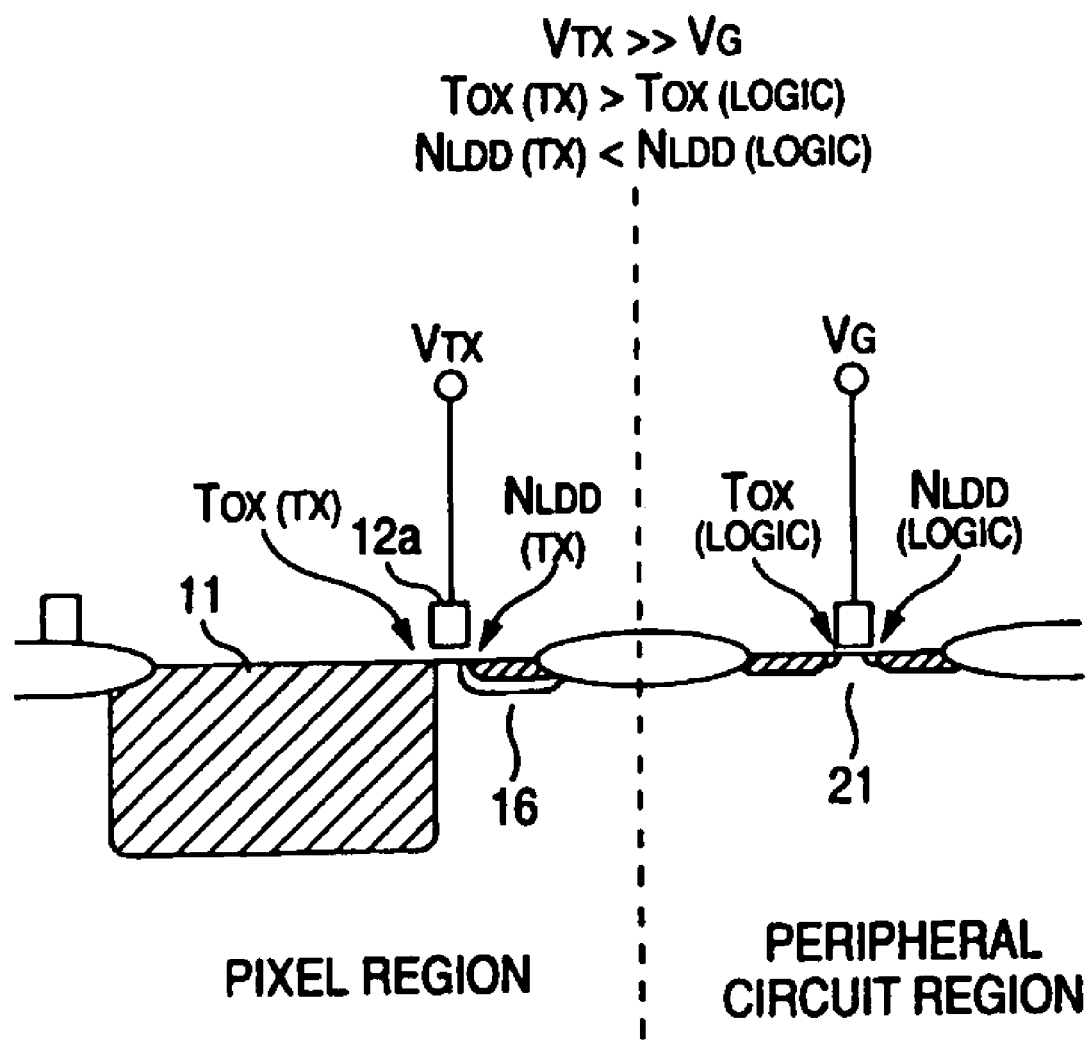
FIG. 6 is a schematic cross section used to describe a second concrete example.

FIG. 6 is a schematic cross section used to describe a second concrete example. The pixel portion is provided with the light-receiving portion 11 comprising one photo diode, and the transfer gate 12a and a Floating Diffusion (charge-to-voltage conversion portion) 16 corresponding to the light-receiving portion 11, while a Logic Tr. (logic transistor) 21 is disposed in the peripheral circuit region.

In addition, in this example, a film thickness of a gate insulation film is increased only in a portion of the transfer gate 12a of the light-receiving portion 11, and an LDD (lightly doped drain) having a low concentration is provided downstream of charges in the transfer gate 12a.

To be more specific, let Tox (Tx) be a film thickness of the gate insulation film of the transfer gate 12a, and Tox (Logic) be a film thickness of the gate insulation film of the logic transistor 21 in the peripheral circuit region, then Tox(Tx)>Tox(Logic) is satisfied. Let NLDD(Tx) be an impurity concentration of the LDD corresponding to the transfer gate 12a, and NLDD(Logic) be an impurity concentration of the LDD of the logic transistor 21 in the peripheral circuit region, then NLDD(Tx)<NLDD(Logic) is satisfied.

This enables the voltage VTx applied to the transfer gate 12a and the voltage VG applied to the logic transistor 21 to have a relation such that satisfies VTx>>VG. It is thus possible to increase a quantity of saturation charges more than in the first concrete example described above. In short, the second concrete example is more suitable for use that requires an image quality higher than that achieved in the first concrete example.

In either concrete example, a power supply control circuit provided in the peripheral circuit region shown in FIG. 1 is configured in such a manner that the voltage VTx applied to the transfer gate 12a corresponding to the light-receiving portion 11 and the voltage VG applied to the peripheral transistors are provided separately.

Applied voltages such that satisfy VTx>VG as in the first concrete example and such that satisfy VTx>>VG as in the second concrete example can be therefore provided to respective transistors as a driving method of the CMOS solid state imaging device. Hence, not only can the peripheral transistors be reduced in size and power consumption and increased in speed, but also a quantity of saturation charges can be increased simultaneously.

Herein, by setting the voltage VTx applied to the transfer gate 12a to be higher than the voltage VG applied to any of the transistors included in the peripheral circuit regions 20, the peripheral circuit portion can be reduced in size and power consumption and increased in speed to the fullest extent.

In a case where the voltage VTx applied to the transfer gate 12a is set to be higher than the voltages of the transistors included in the peripheral circuit regions 20, and to a greatest value among voltages applied to the gates of all the transistors included in the same chip, when the transistors within the chip are designed to be reduced in size and power consumption and increased in speed, it is possible to ensure a quantity of charges that can be read out from the light-receiving portion to the fullest extent, which can in turn enhance the image quality.

Alternatively, a voltage having the same value as the voltage VTx applied to the transfer gate 12a may be applied to another gate (for example, the gate of the reset transistor 13) included in the pixel.

In this case, the need to adjust a voltage supplied to another gate is eliminated, and a voltage can be applied to another gate from the power supply from which the voltage is applied to the transfer gate 12a.

Because the CMOS solid state imaging device of this embodiment has the advantages as described above, it is particularly useful as an imaging device installed in a compact digital still camera, a cellular phone, and a mobile terminal.

In addition, the invention is also applicable to a CMOS solid state imaging device including a lens system or a separate chip (module type).

As has been described, the invention has advantages as follows. That is, even when a space and power consumption of the peripheral transistors are reduced according to the scaling law while increasing a speed thereof in the CMOS solid state imaging device, a quantity of saturation charges that can be read out from the pixel portion via the transfer gate is not suppressed by a driving voltage of the peripheral transistors. It is thus possible to enhance the ability to express gradation in tone (dynamic range) of the pixel portion.

The invention claimed is:

1. A CMOS solid state imaging device comprising: a pixel portion that performs photoelectric conversion according to a quantity of received light, the pixel portion located within an imaging region having a plurality of pixel portions arranged laterally and longitudinally;

a transfer gate used to read out charges obtained through the photoelectric conversion in the pixel portion, peripheral transistors for processing signals from the plurality of pixel portions provided outside a periphery of the imaging portion in a peripheral circuit region, the peripheral transistors including an amplifying transistor, a logic transistor, and a select transistor corresponding to each imaging region being employed in a power supply circuit that controls a current source supplied to the pixel portion read out using the transfer gate or to a transistor in the imaging region associated with the pixel portion, and the power supply circuit being in the peripheral circuit region, a voltage applied to the transfer gate and a voltage supplied to the peripheral transistors are provided separately, wherein, the power supply circuit device is configured such that the voltage applied to the transfer gate is set higher than the voltage applied to the peripheral gate of the peripheral transistors, the voltage applied to the transfer gate being higher to increase a number of signal charges completely transferred from the plurality of pixel portions;

wherein the voltage applied to the transfer gate is higher than the voltage supplied to the peripheral transistors by a range of between 0.5 V and 1.0 V, wherein a difference in the voltage to the transfer gate and a voltage supplied to the peripheral transistors affects a gate length of the transfer gate and wherein within the range allows the pixel portion to remain unsusceptible.

2. The CMOS solid state imaging device according to claim 1, wherein a thickness of a gate insulation film corresponding to the transfer gate is made thicker than a thickness of a gate insulation film corresponding to the logic transistor.

3. The CMOS solid state imaging device according to claim 1, wherein the CMOS solid state imaging device is configured to have an impurity profile in which only a charge-to-potential conversion portion, provided downstream of charges in the transfer gate, is field-mitigated.

4. The CMOS solid state imaging device according to claim 1, wherein the voltage applied to the transfer gate is applied to one or more other gates in the pixel portion reducing size and power consumption of the CMOS solid state imaging device.

5. The CMOS solid state imaging device according to claim 1, wherein a number of signal charges completely transferred from the plurality of pixel portions are a quantity of saturation signals.

6. A method of driving a CMOS solid state imaging device that transfers charges obtained through photoelectric conversion in a pixel portion to charge-to-potential converting means via a transfer gate, the pixel portion located within an imaging region having a plurality of pixel portions arranged laterally and longitudinally, comprising the step of:

applying to the transfer gate a voltage which is set higher than a voltage independently applied to a gate of peripheral transistors for processing signals from the plurality of pixel portions provided outside of a periphery of the imaging portion in a peripheral circuit region, the peripheral transistors being employed in a power supply circuit that controls a current source supplied to the pixel portion read out using the transfer gate or to a transistor in the imaging region associated with the pixel portion, the voltage applied to the transfer gate being higher to increase a quantity of saturation signals read from the plurality of pixel portions;

wherein the voltage applied to the transfer gate is higher than the voltage supplied to the peripheral transistors by a range of between 0.5 V and 1.0 V, wherein a difference in the voltage to the transfer gate and a voltage supplied to the peripheral transistors affects a gate length of the transfer gate and wherein within the range allows the pixel portion to remain unsusceptible.

7. A solid state imaging device, comprising:

an imaging region and a peripheral circuit region provided in a same chip in which the peripheral circuit region is present but outside of a periphery of the imaging region, wherein, the imaging region includes plural pixels arranged laterally and longitudinally, each of the plural pixels has a light-receiving portion that generates charges according to a quantity of received light, and a transfer gate that reads out the charges from the light-receiving portion and a voltage applied to the transfer gate is higher than a voltage independently applied to a gate of any transistors included in the peripheral circuit region, each peripheral transistor being employed in a circuit that controls a current source supplied to a respective one of the light-receiving portions or to a transistor in the imaging region associated with the one light-receiving portion;

wherein the voltage applied to the transfer gate is higher than the voltage supplied to the peripheral transistors by a range of between 0.5 V and 1.0 V, wherein a difference in the voltage to the transfer gate and a voltage supplied to the peripheral transistors affects a gate length of the transfer gate and wherein within the range allows the pixel portion to remain unsusceptible.

8. The solid state imaging device according to claim 7, wherein the voltage applied to the transfer gate is the highest voltage among voltages applied to all transistors provided in the chip.

9. The solid state imaging device according to claim 8, wherein each pixel includes, in addition to the transfer gate, a gate to which a voltage having a same value as the voltage applied to the transfer gate is applied.

10. A solid state imaging device according to claim 7, wherein the circuit is a power supply circuit in the peripheral circuit region, the peripheral transistors including an amplifying transistor, a logic transistor, and a select transistor corresponding to each imaging region, the voltage applied to the transfer gate being higher to increase a number of signal charges completely transferred from the plurality of pixel portions.

11. The devices according to any one of claims 1 and 7, wherein the transfer gate corresponds to a read transistor, and the voltage applied to the transfer gate is the maximum voltage applied to gates of all the transistors in the imaging region and peripheral circuit region, the CMOS solid state imaging device being a 3-transistor type CMOS solid state imaging device or 4-transistor type CMOS solid state imaging device.

12. The devices according to any one of claims 1, and 7, wherein the voltage applied to the transfer gate is 0.5 V higher than the voltage the voltage supplied to the peripheral transistors.

* * * * *